(12) United States Patent
Lin et al.

(10) Patent No.: US 11,646,325 B2
(45) Date of Patent: May 9, 2023

(54) PIXEL STRUCTURE, ARRAY SUBSTRATE AND DISPLAY PANEL

(71) Applicant: HKC CORPORATION LIMITED, Guangdong (CN)

(72) Inventors: Hung-chun Lin, Guangdong (CN); Tienhao Chang, Guangdong (CN); Yunqin Hu, Guangdong (CN); Hongyan Chang, Guangdong (CN); Ming hung Shih, Guangdong (CN); Cheng-hung Chen, Guangdong (CN); Wei Li, Guangdong (CN)

(73) Assignee: HKC CORPORATION LIMITED, Shenzhen (CN)

( * ) Notice: Subject to any disclaimer, the term of this patent is extended or adjusted under 35 U.S.C. 154(b) by 91 days.

(21) Appl. No.: 17/206,481

(22) Filed: Mar. 19, 2021

(65) Prior Publication Data

US 2022/0102382 A1    Mar. 31, 2022

(30) Foreign Application Priority Data

Sep. 27, 2020    (CN) .......................... 202011038822.0

(51) Int. Cl.
*G02F 1/1362*    (2006.01)
*H01L 27/12*    (2006.01)
*G09G 3/20*    (2006.01)

(52) U.S. Cl.
CPC ............. *H01L 27/124* (2013.01); *G09G 3/20* (2013.01); *H01L 27/1218* (2013.01); *G09G 2300/0426* (2013.01)

(58) Field of Classification Search
CPC .................................................... G02F 1/1362
See application file for complete search history.

(56) References Cited

U.S. PATENT DOCUMENTS

| | | | |
|---|---|---|---|
| 2015/0092127 A1* | 4/2015 | Yonekura | G02F 1/134336 349/39 |
| 2016/0322016 A1* | 11/2016 | Kim | G09G 3/3648 |

(Continued)

FOREIGN PATENT DOCUMENTS

| | | |
|---|---|---|
| CN | 102087842 A | 6/2011 |
| CN | 202421681 U | 9/2012 |

(Continued)

OTHER PUBLICATIONS

The First Chinese Office Action dated Jun. 10, 2021; Appln. No. 202011038822.0.

(Continued)

*Primary Examiner* — Sang V Nguyen
(74) *Attorney, Agent, or Firm* — Westbridge IP LLC

(57) ABSTRACT

The present disclosure discloses a pixel structure, an array substrate and a display panel. The pixel structure includes a first data line; a first gate line and a second gate line; a first pixel unit and a second pixel unit. The first pixel units and second pixel units arranged along a second direction; a first pixel electrode relative to the second pixel electrode is close to the first data line, a first thin film transistor and second thin film transistors are arranged close to the first data line; first connecting trace is set between the first drain electrode and the first pixel electrode, a second connecting trace is set between the second drain electrode and the second pixel electrode to make a capacitance of the first pixel unit matching with a capacitance of the second pixel unit.

20 Claims, 8 Drawing Sheets

(56) References Cited

U.S. PATENT DOCUMENTS

| | | | |
|---|---|---|---|
| 2017/0277008 A1* | 9/2017 | Jiang | G02F 1/133512 |
| 2018/0075818 A1 | 3/2018 | Kim et al. | |
| 2019/0088681 A1* | 3/2019 | Mu | H01L 27/124 |
| 2019/0271889 A1* | 9/2019 | Zhan | H01L 27/1259 |
| 2022/0130918 A1* | 4/2022 | Yamazaki | G02F 1/136286 |

FOREIGN PATENT DOCUMENTS

| | | | | |
|---|---|---|---|---|
| CN | 103022141 A | | 4/2013 | |
| CN | 104155820 A | | 11/2014 | |
| CN | 104730786 A | | 6/2015 | |
| CN | 105182638 A | | 12/2015 | |
| CN | 105589273 A | | 5/2016 | |
| CN | 105974706 A | | 9/2016 | |
| CN | 110286537 A | | 9/2019 | |
| CN | 110456585 A | | 11/2019 | |
| CN | 210155492 U | | 3/2020 | |
| JP | 2014-26069 | * | 2/2014 | G02F 1/1368 |
| JP | 2014026069 A | | 2/2014 | |
| JP | 2015072339 A | | 4/2015 | |
| JP | 2018189937 A | | 11/2018 | |
| KR | 20060125238 A | | 12/2006 | |
| KR | 20150002254 | * | 1/2015 | G02F 1/1362 |
| KR | 20150002254 A | | 1/2015 | |
| KR | 101541353 B1 | | 8/2015 | |
| KR | 20150125527 A | | 11/2015 | |
| KR | 20180014337 A | | 2/2018 | |

OTHER PUBLICATIONS

The International Search Report and Written Opinion dated Jun. 30, 2021; PCT/CN2020/140470.
Notice of Reasons for Refusal issued in counterpart Japanese Patent Application No. 2021-578202, dated Jan. 24, 2023.

* cited by examiner

PIXEL STRUCTURE, ARRAY SUBSTRATE AND DISPLAY PANEL

TECHNICAL FIELD

The present disclosure is related to a technical field of display, specially related to a pixel structure, an array substrate and a display panel.

BACKGROUND

In the display panel, a dual-gate pixel driving structure is used, so that gate lines are doubled, while data lines is reduced by half, and the drive cost can be reduced, thereby the production cost can be reduced. In a dual-gate driving pixel structure, if the two adjacent columns of pixel units are connected to the same data line and are symmetrically arranged on two sides of the data lines, the vertical lines and the like are easy to occur. In order to improve the display quality, it can allow two adjacent pixel units as a group, connected to the same data line and arranged on the same side of the data line. The two adjacent groups of pixels in the same column are connected to different data lines, which could cause the polarity of a group of pixels is opposite to the polarities of its upper, lower, left and right groups of pixels, thereby to improve the display quality.

However, this arrangement will cause a difference of the distances of two pixel units connected to the same data line to the data line, and such difference of distances will cause that the capacitances of the two adjacent pixel units do not match each other, causing non-uniform brightness distribution and poor display. If for improving the uniformity of the capacitances, the thin film transistor is arranged in between the two pixel units to achieve a capacitance matching purpose, the opening ratio of the pixels is reduced or pixel electrode symmetry is not good.

SUMMARY

The main purpose of the present disclosure is to provide a pixel structure, an array substrate and a display panel, aiming to improve a pixel opening ratio and pixel electrode symmetry, ensuring a capacitance matching between pixel units, in order to optimize the display quality.

To realize the above purpose, the present disclosure provides a pixel structure including:

a first data line extending in a first direction;

a first gate line and a second gate line, the first gate line and the second gate line both extend in a second direction across the first direction;

a first pixel unit, the first pixel unit includes a first pixel electrode and a first thin film transistor, the first thin film transistor includes a first gate electrode connected to the first gate line, a first source electrode connected to the first data line and a first drain electrode connected to the first pixel electrode;

a second pixel unit including:
a second pixel electrode; and
a second thin film transistor including:
a second gate electrode connected to the second gate line;
a second source electrode connected to the first data line; and
a second drain electrode connected to the second pixel electrode.

The first pixel unit and the second pixel unit are aligned in the second direction. The first pixel electrode is set close to the first data line corresponding to the second pixel electrode, the first thin film transistor and the second thin film transistor are both set close to the first data line.

A first connecting trace is set between the first drain electrode and the second pixel electrode, a second connecting trace that matches capacitors of the first pixel unit and the second pixel unit is set between the second drain electrode and and the second pixel electrode.

Optionally, the first pixel unit and the second pixel unit are set on a same side of the first data line.

Optionally, the first thin film transistor and the second thin film transistor are respectively set on two sides of the first pixel electrode along the first direction and are symmetrically arranged.

Optionally, shapes of the first pixel electrode and the second pixel electrode are the same and the first pixel electrode and the second pixel electrode are set symmetrically.

Optionally, the first gate line includes a first containing section set away from the first pixel electrode in the first direction, a first connecting section close to the second pixel electrode in the first direction, and a first bending section set between the first containing section and the first connecting section; a containing space to contain the first thin film transistor is formed between the first containing section and the first bending section; the second gate line includes a second containing section set away from the first pixel electrode in the first direction, a second connecting section set close to the second pixel electrode in the first direction and a second bending section set between the second containing section and the second connecting section; a containing space of the second thin film transistor is formed between the second containing section and the second bending section.

Optionally, two terminals of the first gate line connected to the first gate electrode are set in a staggered manner in the first direction; and two terminals of the second gate line connected to the second gate electrode are set in a staggered manner in the first direction.

Optionally, the first source electrode and the first drain electrode are both extendedly arranged along the second direction; and the second source electrode and the second drain electrode are both extendedly arranged the second direction.

Optionally, line impedances of the first connecting trace and the second connecting trace are equivalent.

Optionally, lengths of the first connecting trace and the second connecting trace are equivalent, and widths of the first connecting trace and the second connecting trace are equivalent.

Optionally, a storage capacitance formed by the first connecting trace is equal to a storage capacitance formed by the second connecting trace.

Optionally, the pixel structure further includes a common electrode; storage capacities of the first pixel unit are formed by the common electrode and the first pixel electrode as well as the common electrode and the first connecting trace; storage capacities of the second pixel unit are formed by the common electrode and the second pixel electrode as well as the common electrode and the second connecting trace.

Optionally, there are a plurality of the first data lines, and the plurality of first data lines are arranged in the second direction; the pixel structure includes a plurality of the first gate lines and a plurality of second gate lines, the plurality of the first gate lines and the second gate lines are arranged along the first direction; the pixel structure includes a plurality of the first pixel units and a plurality of second pixel units, the plurality of the first pixel units and the plurality of second pixel units are arranged in an array. A pixel group is formed by one first pixel unit and one second pixel unit, which are adjacent with each others in the second direction and are connecting to a same first data line, two pixel groups adjacent in the first direction are respectively connected to two adjacent first data lines.

Optionally, projections of the two adjacent pixel groups in the first direction are arranged embeddedly.

Optionally, the pixel structure includes at least two first data lines; a third pixel unit connected to the first gate line and a fourth pixel unit connected to the second gate line; the third pixel unit and the first pixel unit are respectively connected to two of the at least two first data lines, the third pixel unit and the fourth pixel unit are connected to a same one of the at least two first data lines; the third pixel unit includes a third pixel electrode and a third thin film transistor, including a third gate electrode connected to the first gate line, a third source electrode connected to one of the at least two first data lines and a third drain electrode connected to the third pixel electrode; the fourth pixel unit includes a fourth pixel electrode and a fourth thin film transistor including a fourth gate electrode connected to the second gate line, a fourth source electrode connected to the one of the at least two first data lines, and a fourth drain electrode connected to the fourth pixel electrode. The fourth pixel electrode is set closer to one of the at least two first data lines than the third pixel electrode, the third thin film transistor and the fourth thin film transistor are both set closed to the one of the at least two first data lines; a third connecting trace is set between the third drain electrode and the third pixel electrode, a fourth connecting trace is set between the fourth drain electrode and the fourth pixel electrode to correspond to the third connecting trace and match a capacitance of the third pixel unit with a capacitance of the fourth pixel unit.

Optionally, the first pixel unit and the second pixel unit are respectively located at two sides of the first data line.

Optionally, a third pixel unit is set between the second pixel unit and the first data line, the third pixel unit is connected to a second data line that is extended along the first direction and is adjacent to the first data line; a side of the second data line that is far from the third pixel line is connected to the fourth pixel unit; the third pixel unit is connected to the first gate line, the fourth pixel unit is connected to the second gate line.

The present disclosure provides on the other hand an array substrate includes a base substrate and the pixel structure; the base substrate is formed with:

a first metal layer forming a first gate line, a second gate line, a first gate electrode and a second gate electrode;

a first insulating layer set on the first metal layer;

a second metal layer set on the first insulating layer and forming the first data line, the first source electrode, the first drain electrode, the second source electrode and the second drain electrode;

a second insulating layer set on the second metal layer;

a transparently conductive layer forming the first pixel electrode and the second pixel electrode;

the first connecting trace and the second connecting trace each includes a metal line section formed by the second metal layer, an transparent line section formed by the transparently conductive layer and a via connecting section set between the transparent line and the metal line and crossing through the second insulating layer.

Optionally, it further includes a color resistance layer set on the second insulating layer, the transparent line section is set on the color resistance layer; the via connecting section is set to be crossing through the color resistance layer.

Optionally, the first connecting trace and the second connecting trace matches the capacitor of the first pixel unit with the capacitor of the second pixel unit through a matching setting of the transparent line section.

The present disclosure on the other hand provides a display panel including a pixel structure of any one of the above, or an array substrate of any one of the above and a color film substrate set oppositely to the array substrate.

The present disclosure provides a pixel structure, an array substrate and a display panel provided with a first data line, a first gate line, a second gate line, a first pixel unit and a second pixel unit, in particular the first pixel electrode relative to the second pixel electrode is set close to the first data line, a first thin film transistor and second thin film transistors are arranged close to the first data line. The first connecting trace is arranged between the first drain electrode and the first pixel electrode, the second connecting trace that matches the capacitances of the first pixel units and second pixel units the second drain electrode and the second pixel electrode corresponding to the first connecting trace is set between the second drain electrode and the second pixel electrode. According to the disclosure, through setting that the first thin film transistor and the second thin film transistor are close to the first data line, and through the first connecting trace and the second connecting trace, the first pixel units and the second pixel unit capacitance are matched, the occupation area of the non-display area is effectively reduced, improving the pixel opening rate and ensuring the symmetry of the pixel electrode, ensuring the matching of the capacitance between pixel units, improving the display brightness uniformity, and optimizing the display quality.

BRIEF DESCRIPTION OF THE DRAWINGS

In order to explain the embodiments of the present disclosure or the technical solutions in the related art more clearly, the following will briefly introduce the drawings that need to be used in the description of the embodiments or prior art. Obviously, the drawings in the following description are only some embodiments of the present disclosure. For those of ordinary skill in the art, without creative work, other drawings can be obtained based on the structure shown in these drawings.

The reference signs are illustrated below.

Figure 1:
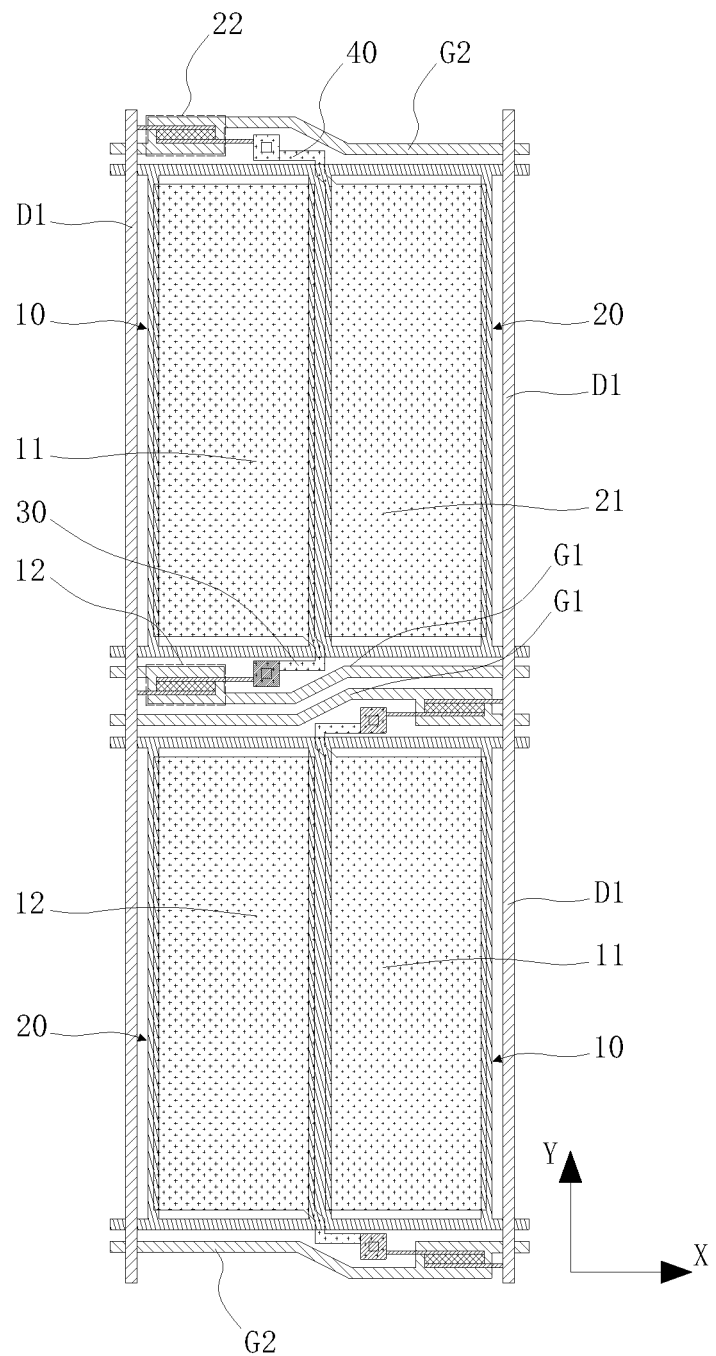
FIG. 1 is a schematic structural diagram of an embodiment of a pixel structure of the present disclosure.

10, first pixel unit; 11, first pixel electrode; 12, first thin film transistor; 121, first gate electrode; 122, first source electrode; 123, first drain electrode; 20, second pixel unit; 21, second pixel electrode; 22, second thin film transistor; 221, second gate electrode; 222, second source electrode; 223, second drain electrode; 30, first connecting trace; 40, second connecting trace; 50, third pixel unit; 51, third pixel electrode; 52, third thin film transistor; 521, third gate electrode; 522, third source electrode; 523, third drain electrode; 60, fourth pixel unit; 61, fourth pixel electrode; 62, fourth thin film transistor; 621, fourth gate electrode; 622, fourth source electrode; 623, fourth drain electrode; 70, third connecting trace; 80, fourth connecting trace; 100, pixel group; D1, first data line; D2, second data line; G1 first gate line; G11, first containing section; G12, first bending section; G13, first connecting section; G2 second gate line; G21, second containing section; G22, second bending section; G23, second connecting section; V1, common electrode; GS, base substrate, M1, first metal layer; M2, second metal layer; P1, first insulating layer; P2, second insulating layer; ITO, transparently conductive layer; B1, color resistance layer; L1, metal line section; L2, transparent line section; 13 via connecting section.

The realization of the objectives, functional characteristics and advantages of the present disclosure will be further described in conjunction with the embodiments and with reference to the drawings.

DETAILED DESCRIPTION OF THE EMBODIMENTS

The technical solutions in the embodiments of the present disclosure will be clearly and completely described in connection with the accompanying drawings in the embodiments of the present disclosure, and obviously, the described embodiments are only a part of the embodiments of the disclosure and not all embodiments. Based on the embodiments of the present disclosure, all other embodiments obtained by one of ordinary skill in the art without creative work are within the scope of the present disclosure.

It should be noted that, in the embodiments of the present disclosure, directional indications (such as upper, lower, left, right, front and rear) are involved. The directional indication is only used to interpret the relative positional relationship, motion condition, etc. between the components in a particular posture (as shown in the figure), and if the specific posture changes, the directional indication changes accordingly.

In addition, the descriptions of "first", "second" and the like are used for descriptive purposes only in the embodiments of the present disclosure and are not to be construed as indicating or implying the relative importance or implicitly indicating the number of technical features. Thus, a feature defined with "first", "second" may explicitly or implicitly include at least one of such feature. In addition, the technical solutions between the various embodiments can be combined with each other, but must be realized by a person of ordinary skill in the art, and when a combination of technical solutions is contradictory or cannot be realized, the combination of the technical solutions should not be considered to exist and are not within the protection scope of the disclosure.

The term "and/or" as used in the present disclosure, is merely an association relationship that describes associated objects, indicating that there may be three relationships, for example, A and/or B, which may be expressed as: A alone, A and B being present, and B alone. In addition, the character "/", in general, indicates that the front-and-back correlated objects are in an "or" relationship.

The present disclosure provides a pixel structure, which can be applied to a dual-gate pixel driving structure.

A Dual-Gate Pixel Driving Structure (Dual-Gate), which may also be referred to as a DRD (Double-Rate Driving) structure, the gate lines have been doubled, and meanwhile, the data lines have been reduced by half. In the display panel, only GOA driving circuits need to be increased for the increase of the gate lines, the production cost is not increased significantly. A number of integrated chips in a source driving circuit is reduced by half since the data lines are reduced by half. A number of ICs of the panel can be reduced, the driving cost can be effectively reduced by adopting a dual-gate pixel driving structure, and therefore the production cost of the display panel is reduced.

Two adjacent data lines in a data line driver of the general display panel are opposite in polarities. The disclosure can adopt + or − to represent the positive and negative polarity of a pixel in a same frame. As long as the pixels are designed to be staggered to the left and right of the data line, it can make the pixels of left and right, up and down opposite to each other in polarity, so that the pixels can have better image quality. However, same data line driving in the general DRD structure can make one column of pixels extending along the data line have the same polarity, which is easy to cause poor image quality. In order to improve the quality of a picture, two adjacent pixel units can be a group, connected to a same data line and are both set on a same side of the data line, and two adjacent groups of pixels in a same column are connected to different data lines, a group of pixels can be made to be opposite to polarities of pixel groups on the up-and-down, left-and-right sides thereof, thereby improving the display quality. However, the method has the disadvantage that distances between the two pixels connected to the same data line and the data line are different, causing that capacitance of two adjacent pixels do not match with each other, and display defects caused by uneven brightness and darkness distribution can be caused. In order to lighten an unevenness of the capacitances, If the thin film transistors of the pixels are set in the middle of every two data lines, namely between every two adjacent pixels, source electrode lines of the thin film transistors of the two pixels can be equivalent, so that a capacitance matching can be achieved between every two adjacent pixels connected to the same data line, but the data lines and the thin film transistors in the middle of the data lines may occupy the arrangement area of the pixel electrodes, so that a pixel opening rate is reduced, or symmetry of the pixels is poor.

Figure 2:
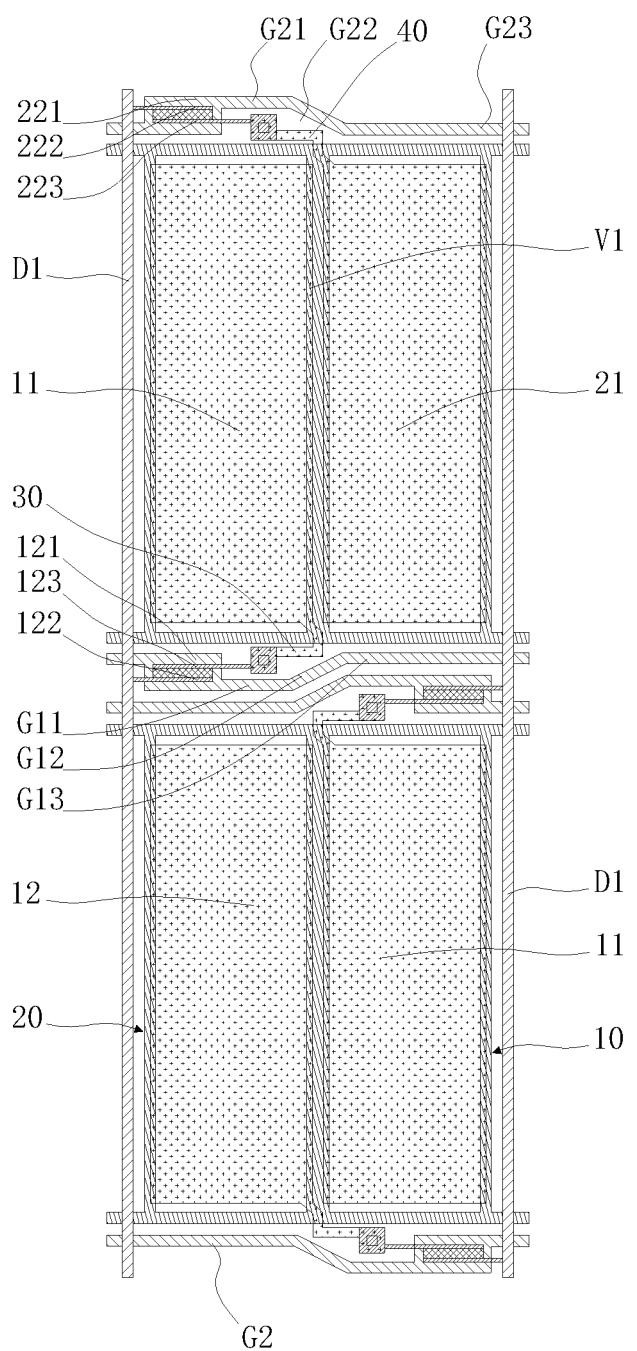
FIG. 2 is another structural diagram of an embodiment of the pixel structure of the present disclosure.

In order to solve the above problem, please refer to FIG. 1 and FIG. 2, which shows the pixel structure provided by an embodiment of the present disclosure. The pixel structure includes:

a first data line D1 extended in a first direction (e.g., the illustrated Y direction);

a first gate line G1 and a second gate line G2 both extended in a second direction (e.g., the illustrated X direction) that intersects the first direction;

a first pixel unit 10 including a first pixel electrode 11 and a first thin film transistor 12, where the first thin film transistor 12 includes a first gate electrode 121 connected with the first gate line G1, a first source electrode 122 connected with the first data line D1, and a first drain electrode 123 connected with the first pixel electrode 11;

a second pixel unit 20 including a second pixel electrode 21 and a second thin film transistor 22, where the second thin film transistor 22 includes a second gate electrode 221 connected with the second gate line G2, a second source electrode 222 connected with the first data line D1, and a second drain electrode 223 connected with the second pixel electrode 21.

The first pixel unit 10 and the second pixel unit 20 are arranged in the second direction; the first pixel electrode 11 is set closer to the first data line D1 than the second pixel electrode 21, and the first thin film transistor 12 and the second thin film transistor 22 are set close to the first data line D1.

A first connecting trace 30 is set between the first drain electrode 123 and the first pixel electrode 11, and a second connecting trace 40 corresponding to the first connecting trace 30 is arranged between the second drain electrode 223 and the second pixel electrode 21 so that capacitances of the first pixel unit 10 and the second pixel unit 20 are matched.

In the present embodiment, the first pixel electrode 11 is set closer to the first data line D1 than the second pixel electrode 21. Namely, the distance between the first pixel electrode 11 and the first data line D1 and the distance between the second pixel electrode 21 and the first data line D1 are different. The first thin film transistor 12 and the second thin film transistor 22 are both arranged close to the first data line D1. Namely, the first thin film transistor 12 and the second thin film transistor 22 are both arranged on one side of the first data line D1, and therefore, the distance between the first thin film transistor 12 and the first pixel electrode 11 is not equal to the distance between the second thin film transistor 22 and the second pixel electrode 21. In the embodiment, the first thin film transistor 12 and the second thin film transistor 22 are both arranged on one side of the first data line D1 to effectively avoid the problem that the first thin film transistor 12 and the second thin film transistor 22 are placed in the middle of the first pixel electrode 11 and the second pixel electrode 21 to occupy the pixel electrode arrangement area, so that the first pixel electrode 11 and the second pixel electrode 21 can have better symmetry, an area of the non-display area is reduced, and the pixel opening rate is improved.

Moreover, the first connecting ling 30 connecting the first drain electrode 123 and the first pixel electrode 11 and the second connecting trace 40 connecting the second drain electrode 223 and the second pixel electrode 21 are set correspondingly so that the capacitances of the first pixel unit 10 and the second pixel unit 20 are matched. Namely, through the matching arrangement of the first connecting trace 30 and the second connecting trace 40, the capacitance matching of the first pixel unit 10 and the second pixel unit 20 is ensured. The display brightness uniformity is improved, the display quality is improved, the capacitance matching is achieved through the first connecting trace 30 and the second connecting trace 40 which both serve as drain connecting traces, the difficulty of line arrangement is reduced, and the difficulty of production process is reduced.

In the embodiment, the first pixel unit 10 and the second pixel unit 20 are sandwiched between the first gate line G1 and the second gate line G2, namely, the first gate line G1 and the second gate line G2 are set on both sides of the first pixel unit 10 and the second pixel unit 20 respectively. The first gate line G1 is connected to the first gate electrode 121 of the first thin film transistor 12. The second gate line G2 is connected to the second gate electrode 221 of the second thin film transistor 22. The first data line D1 is connected to the first source electrode 122 of the first thin film transistor 12 and the second source electrode 222 of the second thin film transistor 22 at the same time. Thus, the two pixel units in the first direction namely an extension direction of the gate lines are connected to different gate lines, and are connected to the same data line, so that a dual-gate driving structure is formed, the driving cost is reduced, and the production cost is reduced.

In this embodiment, the capacitance matching may refer to a storage capacitance of the first pixel unit 10 matching with a storage capacitance of the second pixel unit 20, such as that the storage capacitance of the first pixel unit 10 is equal to the storage capacitance of the second pixel unit 20. In the embodiment, the pixel structure further includes a common electrode V1. The storage capacitances of the first pixel unit 10 are formed by a capacitance formed between the common electrode V1 and the first pixel electrode 11 as well as a capacitance formed between the common electrode V1 and the first connecting trace 30, namely, the storage capacitance of the first pixel unit 10 includes the capacitance formed between the common electrode V1 and the first pixel electrode 11 and the capacitance formed between the common electrode V1 and the first connecting trace 30. The storage capacitance of the second pixel unit 20 is formed by a capacitance formed between the common electrode V1 and the second pixel electrode 21 as well as a capacitance formed between the common electrode V1 and the second connecting trace 40. Namely, the storage capacitance of the second pixel unit 20 includes a capacitance formed between the common electrode V1 and the second pixel electrode 21 and a capacitance formed between the common electrode V1 and the second connecting trace 40. In this embodiment, the common electrode V1 is arranged on peripheral sides of the first pixel electrode 11 and the second pixel electrode 21 and is overlappedly set with the first pixel electrode 11 and the second pixel electrode 21, so that such arrangement can increase overlapping areas between the common electrode V1 and the first pixel electrode 11 and between the common electrode V1 and the second pixel electrode 21, thereby increasing the storage capacitance.

In one embodiment, the capacitance matching may refer to a matching between a sum of capacitances of the first pixel unit 10 and a sum of capacitances of the second pixel unit 20, for instance, the sum of the capacitances of the first pixel unit 10 is equal to the sum of the capacitances of the second pixel unit 20. The capacitance formed in the first pixel unit 10 includes a capacitance formed by the first pixel electrode 11 and the first data line D1, a capacitance formed by the first pixel electrode 11 and the first gate line G1, a storage capacitance of the first pixel unit 10, a liquid crystal capacitance that includes a capacitance formed by the first pixel unit 10 and a common electrode on a color film substrate, and a capacitance between the first pixel electrode 11 and adjacent pixel electrodes. Similarly, the capacitance formed in the second pixel unit 20 includes a capacitance formed by the second pixel electrode 21 and the second data line D2, a capacitance formed by the second pixel electrode 21 and the second gate line G2, a storage capacitance of the second pixel unit 20, a liquid crystal capacitance that includes a capacitance formed between the second pixel unit 20 and a common electrode on the color film substrate, and a capacitance between the second pixel electrode 21 and adjacent pixel electrodes. In the embodiment, the capacitance matching can further refer to the capacitance matching of each capacitance of the first pixel unit 10 with each capacitance of the second pixel unit 20 correspondingly, such that all capacitances of the first pixel unit 10 are equivalent to the counterparts of the second pixel unit correspondingly. In the embodiment, since the first thin film transistor 12 and the second thin film transistor 22 are both set on one side of the first data line D1, it is ensured that the first pixel electrode 11 and the second pixel electrode 21 can have better symmetry, the arrangement matching of the first pixel unit 10 and the second pixel unit 20 is ensured, and the matching of the sum of capacitances of the first pixel unit 10 and the sum of capacitances of the second pixel unit 20 can be ensured. Under the condition that the distance between the first thin film transistor 12 and the first pixel electrode 11 and the distance between the second thin film transistor 22 and the second pixel electrode 21 are not equal, capacitance matching is realized through the matching arrangement of the first connecting trace 30 and the second connecting trace 40, the difficulty of trace arrangement is reduced, the difficulty of the matching of capacitances is reduced, the difficulty of the production process is reduced, and the product production efficiency and yield are improved.

In one embodiment, trace impedances of the first connecting trace 30 and the second connecting trace are equal, thereby ensuring that the capacitance formed by the first pixel electrode 11 and the capacitance formed by the second pixel electrode 21 are matched, and the display quality is improved. In the embodiment, referring to FIG. 1, lengths and widths of the first connecting trace 30 and the second connecting trace 40 are the same and widths of the first connecting trace 30 and the second connecting trace 40 are the same, so as to ensure the trace impedances to be equivalent. Of course, in another embodiment, the lengths and widths of the first connecting trace 30 and the second connecting trace 40 may be different so that the specific arrangement of the first connecting trace 30 and the second connecting trace 40 is matched with the capacitance formed by the first pixel electrode 11 and the second pixel electrode 21, thereby ensuring the capacitance matching between the first pixel unit 10 and the second pixel unit 20.

In one embodiment, the storage capacitance formed by the first connecting trace 30 is equal to the storage capacitance formed by the second connecting trace 40. In the embodiment, referring to FIG. 1, the first thin film transistor 12 and the second thin film transistor 22 are both set on one side of the first data line D1, namely, it is ensured that the first pixel electrode 11 and the second pixel electrode 21 can have better symmetry, thereby ensuring that the storage capacitance formed by the first pixel electrode 11 is equal to the storage capacitance formed by the second pixel electrode 21. Making the storage capacitance formed by the first connecting trace 30 equal to the storage capacitance formed by the second connecting trace 40, the storage capacitance of the first pixel unit 10 can be further effectively ensured to be equal to the storage capacitance of the second pixel unit 20. In the embodiment, the overlapping area of the first connecting trace 30 and the common electrode V1 is equal to the overlapping area of the second connecting trace 40 and the common electrode, so as to ensure that the storage capacitance formed by the first connecting trace 30 is equal to the storage capacitance formed by the second connecting trace 40.

In one embodiment, referring to FIG. 1 and FIG. 2, the first pixel unit 10 and the second pixel unit 20 are set on the same side of the first data line D1. In this embodiment, the first pixel unit 10 and the second pixel unit 20 are set on the same side of the first data line D1 connected to the first pixel unit 10 and the second pixel unit 20, and the first pixel unit 10 and the second pixel unit 20 are set adjacent to each other. Specifically, the first pixel electrode 11 in the first pixel unit 10 and the second pixel electrode 21 in the second pixel unit 20 are set side by side in the first direction, namely the extension direction of the gate line, and the first pixel electrode 11 is closer to the first data line D1 than the second pixel electrode 21, namely the first pixel electrode 11 is set on one side of the first data line D1, and the second pixel electrode 21 is set on one side of the first pixel electrode 11 far away from the first data line D1. In this way, the arrangement of the pixel units is facilitated. The first thin film transistor 12 and the second thin film transistor 22 are set on two sides of the first pixel electrode 11 in the first direction and are symmetrically arranged. Namely, the first thin film transistor 12 and the second thin film transistor 22 are merely set on both sides of the first pixel electrode 11 adjacent to the first data line D1, thereby avoiding the problem of reducing an aperture ratio and affecting the pixel electrode symmetry caused by being placed between the first pixel electrode 11 and the second pixel electrode 21. The first thin film transistor 12 and the second thin film transistor 22 are symmetrically set, which is, on one hand, to reduce the manufacturing difficulty of the process, and on the other hand, helpful to ensure the capacitance matching of the first pixel unit 10 and the second pixel unit 20, thereby improving the display quality. Further, the shape of the first pixel electrode 11 and the second pixel electrode 21 is set to be same and the first pixel electrode 11 and the second pixel electrode 21 are symmetrically set, and the display quality is ensured.

In one embodiment, referring to FIG. 1 and FIG. 2, the first gate line G1 includes a first containing section G11 set away from the first pixel electrode 11 in the first direction, a first connecting section G13 disposed adjacent to the second pixel electrode 21 in the first direction, and a first bending section G12 set between the first containing section G11 and the first connecting section G13; and a containing space for containing the first thin film transistor 12 is formed between the first containing section G11 and the first bending section G12. Similarly, the second gate line G2 includes a second containing section G21 set away from the first pixel electrode 11 in the first direction, a second connecting section G23 set adjacent to the second pixel electrode 21 in the first direction, and a second bending section G22 set between the second containing section G21 and the second connecting section G23. A containing space for containing the second thin film transistor 22 is formed between the second containing section G21 and the second bending section G22. In the embodiment, since the first thin film transistor 12 and the second thin film transistor 22 are both set close to the first data line D1, namely, both of the first thin film transistor 12 and the second thin film transistor 22 are set on one side of the first pixel electrode 11, the first gate line G1 forms a containing space for accommodating the first thin film transistor 12 at a position close to the first pixel electrode 11, and is set at a position close to the second pixel electrode 21, namely set close to the second pixel electrode 21. Similarly, the second gate line G2 forms a containing space for containing the second thin film transistor 22 close to the first pixel electrode 11, and is set at a position close to the second pixel electrode 21, namely set close to the second pixel electrode 21, thereby reducing the arrangement areas of the first thin film transistor 12, the second thin film transistor 22, the first gate line G1 and the second gate line G2, thereby, reducing the area of the non-display area and being beneficial to improve the pixel opening rate.

In the embodiment, the first bending section G12 and the second bending section G22 are opposite in directions, the positions of the first containing section G11 and the second containing section G21 correspond to the first pixel electrode 11, and are set away from the first pixel electrode 11 in the direction of the first data line D1. The first bending section G12 extends in the gate line direction and is bent close to the second pixel electrode 21; the second bending section G22 extends in the gate line direction and is bent close to the second pixel electrode 21. Therefore, the first thin film transistor 12 is contained among the first containing section G11, the first bending section G12, the first pixel electrode 11 and the first data line D1. A via portion of the first connecting trace 30 is also set within the containing space that contains the first thin film transistor 12. Similarly, the second thin film transistor 22 is contained among the second containing section G21, the second bending section G22, the first pixel electrode 11 and the first data line D1. A via portion of the second connecting trace 40 is set in the containing space for containing the second thin film transistor 22. By means of such arrangement, the difficulty line arrangement is reduced, and the generation of the parasitic capacitance is reduced.

In one embodiment, referring to FIG. 1 and FIG. 2, the two ends of the first gate line G1 connected to the first gate electrode 121 are staggered in the first direction; the two ends of the second gate line G2 connected to the second gate electrode 221 are set in a staggered manner in the first direction. In the embodiment, the first containing section G11 of the first gate line G1 and the first connecting section G13 are respectively set at a position far away from the first pixel electrode 11 and a position close to the first pixel electrode 11, so that when a plurality of first pixel units 10 and a plurality of second pixel units 20 are arranged in the second direction, namely the gate line direction, one side of the first gate electrode 121 will be connected with the first containing section G11, and the other side of the first gate electrode 121 is connected with the first connecting section G13. Similarly, the second containing section G21 and the second connecting section G23 of the second gate line G2 are respectively set at a position away from the second pixel electrode 21 and at a position close to the second pixel electrode 21, thereby, when a plurality of first pixel units 10 and a plurality of second pixel units 20 are set in the second direction, namely the gate line direction, one side of the second gate 221 will be connected to the second containing section G21; and the other side of the second gate 221 will be connected to the second connecting section G23. The matching arrangement of the first gate line G1 and the first thin film transistor 12 can be facilitated according to the arrangement above, similarly, the matching arrangement of the second gate line G2 and the second thin film transistor 22 is facilitated, the overall compactness of the pixel structure is improved when the plurality of first pixel units 10 and the plurality of second pixel units 20 form an array arrangement, the volume of the non-display area on the display panel is reduced, and the opening ratio of the pixels is improved.

In one embodiment, referring to FIG. 1 and FIG. 2, the first source electrode 122 and the first drain electrode 123 both extend in the second direction; and the second source electrode 222 and the second drain electrode 223 both extend in the second direction. In the embodiment, the first drain electrode 123 and the first source electrode 122 extend in the second direction to form a parallel arrangement, whereby a conductive channel formed between the first source electrode 122 and the first drain electrode 123 is also arranged in the second direction. The second drain electrode 223 and the second source electrode 222 extend in the second direction to form a parallel arrangement, whereby a conductive channel formed between the second source electrode 222 and the second drain electrode 223 is also arranged in the second direction. Further, the first source electrode 122 and the first drain electrode 123 and the formed conductive channel thereof are consistent with the extension direction of the first gate line G1, the second source electrode 222 and the second drain electrode 223 and the formed conductive channel thereof are consistent with the extension direction of the second gate line G2, so that the first thin film transistor 12 and the second thin film transistor 22 can be set narrower in the first direction, so that the area of the non-display area is effectively reduced under the condition that the arrangement area of the pixel electrode is not occupied by the first thin film transistor 12 and the second thin film transistor 22 which are set at one side of the first pixel electrode 11, and the pixel opening rate is improved.

Of course, in a further embodiment, the shape and number of the conductive channels can be adaptively adjusted according to the shapes of the source electrode and the drain electrode. For example, the shape of the channel can be determined according to whether a branch structure is arranged between the first source electrode 122 and the first drain electrode 123, and the number of the channels can be determined as well. In embodiments with multiple channels, aspect ratios of conductive channels can be the same or different and can be set according to actual needs. In a thin film transistor, for example, at least one of the first source electrode 122 and the first drain electrode 123 in the first thin film transistor 12 can be provided as a U-shaped structure or a double I-shaped structure, when the first drain electrode 123 is in a U-shaped structure, the first drain electrode 123 has two parallel side walls, the first source electrode 122 is set in the second direction and is clamped between the two parallel side walls, and two conductive channels are formed between the first source electrode 122 and the U-shaped drain electrode. According to that the pixel electrode and the data line are set on a same layer, the first drain electrode 123 and the first source electrode 122 can be correspondingly changed, for example, when the first drain electrode 123 and the first source electrode 122 are set in a same layer, the first pixel electrode 11 can be directly connected with the first drain electrode 123 without being connected with the first drain electrode 123 through a via, and the first drain electrode 123 can be set as a double I-shaped structure.

Figure 3:
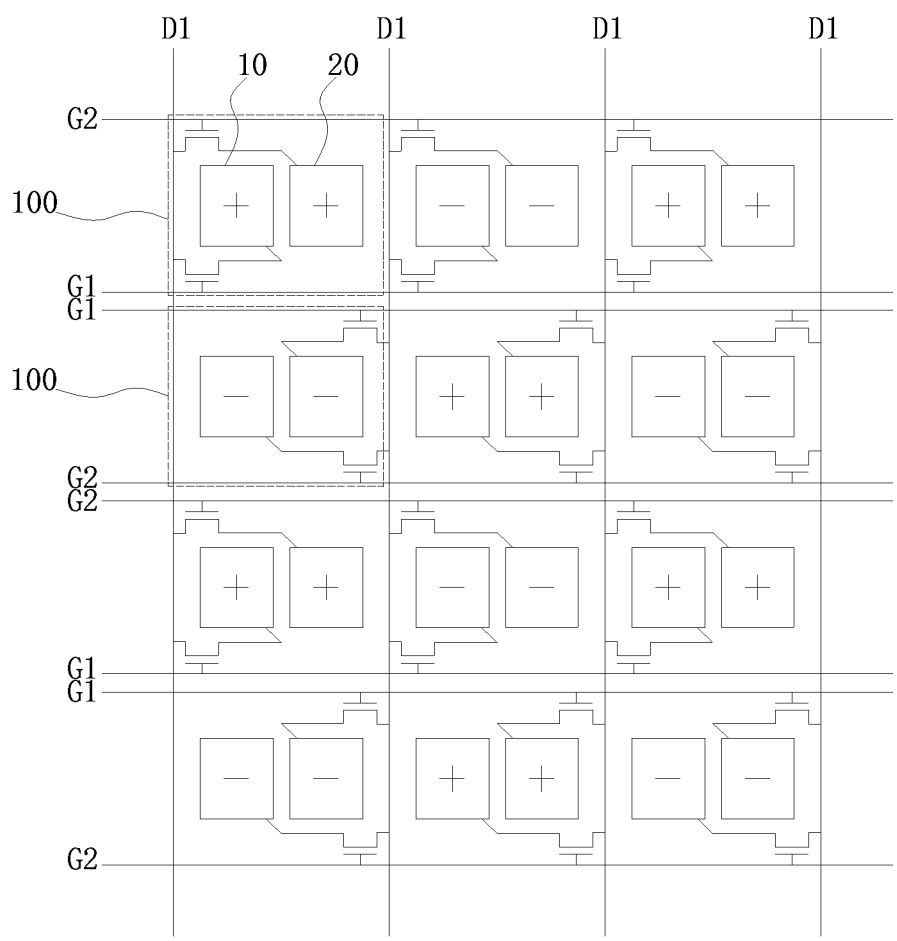
FIG. 3 is a schematic diagram of arrangement of pixel groups of an embodiment of the pixel structure of the present disclosure.

In one embodiment, referring to FIG. 1 to FIG. 3, the number of the first data lines D1 is multiple, and the plurality of first data lines D1 are set in the second direction. The first gate line G1 and the second gate line G2 are both multiple in number, and the plurality of the first gate lines G1 and the second gate lines G2 are set in the first direction. There are a plurality of first pixel units 10 and a plurality of second pixel units 20 and the plurality of first pixel units 10 and second pixel units 20 are set in an array. A pixel group 100 is formed with a first pixel unit 10 and a second pixel unit 20 adjacent to the first pixel unit 10 in the second direction and connected to a same first data line D1. Two adjacent pixel groups 100 in the first direction are respectively connected to two adjacent first data lines D1. Therefore, the pixel structure provided by the embodiment forms a group with two adjacent pixels, and a polarity of each pixel group 100 is opposite to those of the upper-and-lower, left-and-right adjacent pixel groups 100, so that better display quality is provided while the dual-gate driving structure is realized.

In the embodiment, projections of two adjacent pixel groups 100 are embedded in the first direction. In the embodiment, since the first thin film transistor 12 and the second thin film transistor 22 are set close to the first data line D1, two adjacent pixel groups 100 in the first direction are respectively connected to two adjacent first data lines D1, the thin film transistors in the two adjacent pixel groups 100 can be set in a staggered mode, namely the projections of the two adjacent pixel groups 100 can be embedded in each other in the first direction, so that the pixel structure is compact, the area of the non-display area is reduced, and the pixel opening rate can be improved. Specifically, as illustrated in FIG. 1 and FIG. 2, the first pixel unit 10 and the second pixel unit 20 of a first row form a pixel group 100 of the first row; the first pixel unit 10 and the second pixel unit 20 of a second row form a pixel group 100 of the second row. The pixel group 100 of the first row is connected to the first data line D1 located on the left side as shown in the figures, and the pixel group 100 of the second row is connected to the first data line D2 located on the right side as shown in the figures. The first thin film transistor 12 in the first pixel unit 10 of the first row is set between the first pixel electrode 11 of the first row and the second pixel electrode 21 of the second row and is located on the left side as shown in figures; the first thin film transistor 12 in the first pixel unit 10 of the second row is set between the second pixel electrode 21 of the first row and the first pixel electrode 11 of the second row and is located on the right side as shown in figures. Namely, the first thin film transistor 12 in the first pixel unit 10 of the first row and the first thin film transistor 12 in the first pixel unit 10 of the second row are both located between pixel electrodes of the upper-and-lower rows and are set on the left side and the right side respectively, thereby the projections of the two adjacent pixel groups 100 form a mutually embedded relationship in the first direction, so that the pixel structure is compact in arrangement, a utilization rate of the non-display area is greatly improved, the overall area of the non-display area is reduced, and the pixel opening rate is improved.

Figure 4:
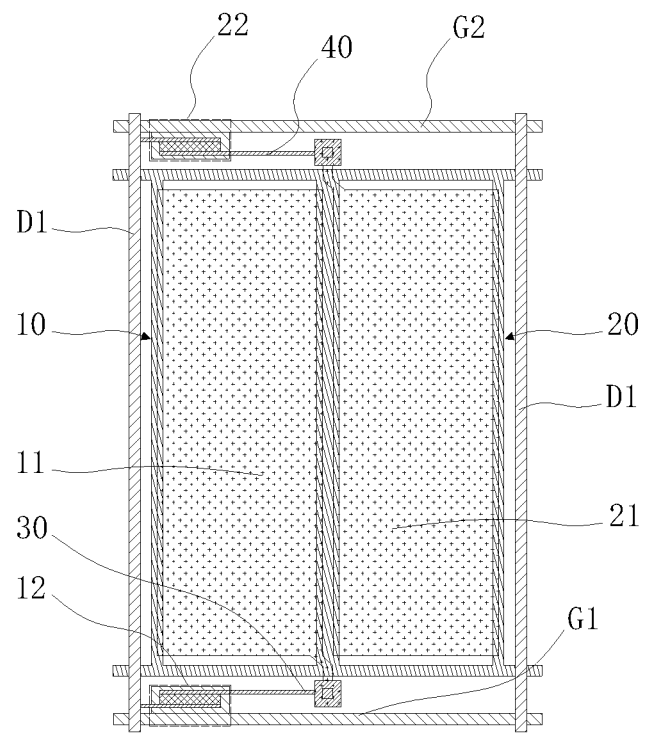
FIG. 4 is a schematic structural diagram of another embodiment of the pixel structure of the present disclosure.

In one embodiment, referring to FIG. 4, the first gate line G1 and the second gate line G2 are arranged to be straight lines, the first thin film transistor 12 is set between the first gate line G1 and the first pixel electrode 11, the second thin film transistor 22 is arranged between the first gate line G2 and the second pixel electrode 21, thereby the arrangement of the gate line can be simplified, and the difficulty of the process can be reduced.

Figure 5:
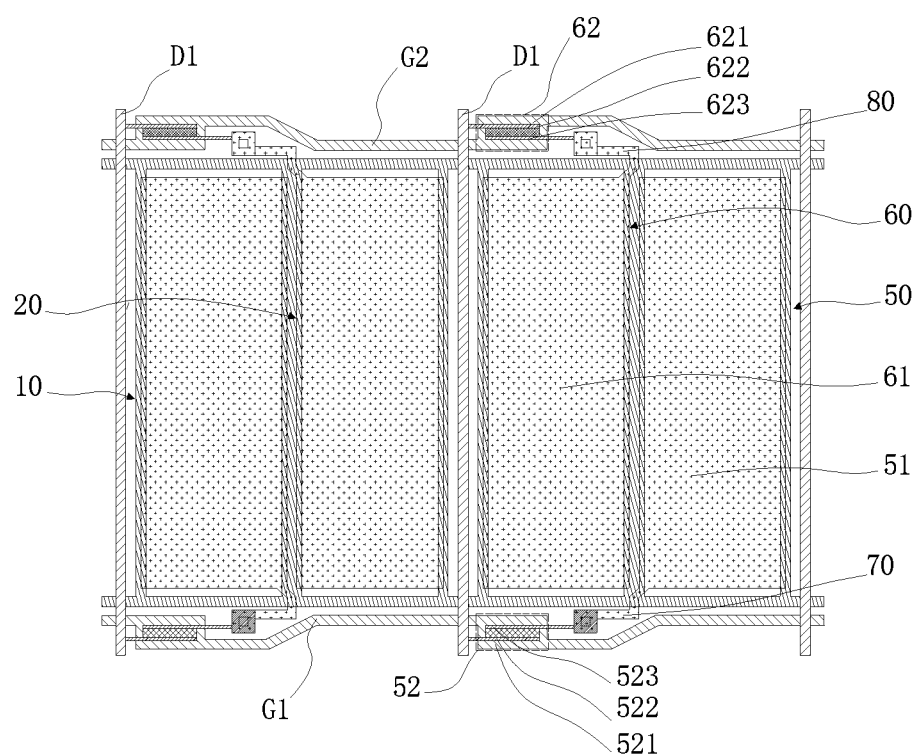
FIG. 5 is a schematic structural diagram of still another embodiment of the pixel structure of the present disclosure.
Figure 6:
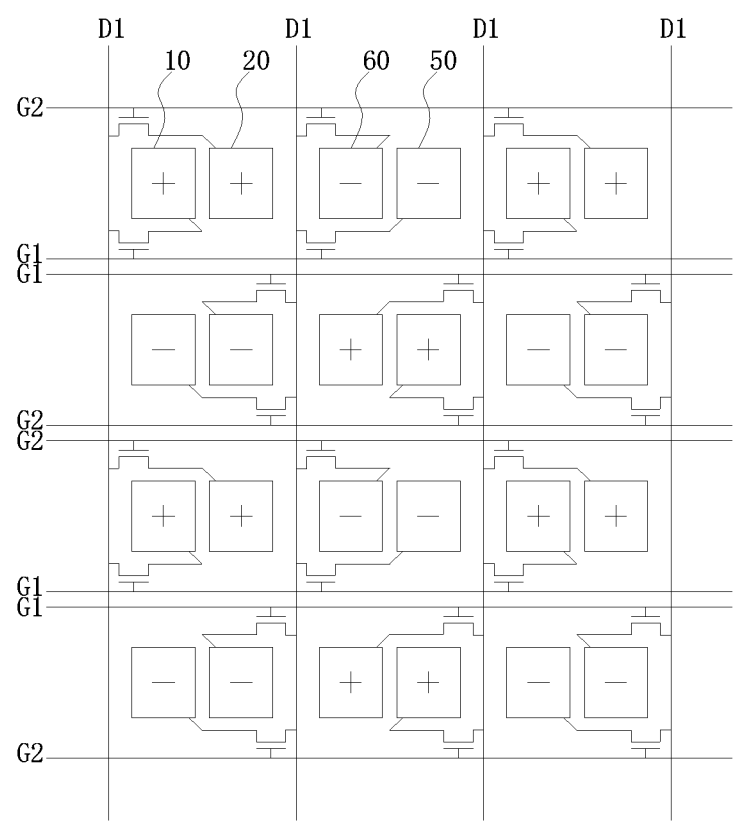
FIG. 6 is a schematic diagram of pixel arrangement of another embodiment of the pixel structure of the present disclosure.

In one embodiment, referring to FIG. 5 and FIG. 6, there are at least two first data lines D1. The pixel structure further includes a third pixel unit 50 connected to the first gate line G1 and a fourth pixel unit 60 connected to the second gate line G2; the third pixel unit 50 and the first pixel unit 10 are respectively connected to two first data lines D1, and the third pixel unit 50 and the fourth pixel unit 60 are connected to a same first data line D1. As shown in FIG. 5, the first pixel unit 10 and the second pixel unit are connected to a first data line D1 located on the left side, and the third pixel unit 50 and the fourth pixel unit unit 60 are connected to a first data line D1 located on the right side. The third pixel unit 50 includes a third pixel electrode 51 and a third thin film transistor 52, the third thin film transistor 52 includes a third gate electrode 521 connected with a first gate line G1, a third source electrode 522 connected with the first data line D1, and a third drain electrode 523 connected with the third pixel electrode 51. The fourth pixel unit 60 includes a fourth pixel electrode 61 and a fourth thin film transistor 62, the fourth thin film transistor 62 includes a fourth gate electrode 621 connected to the second gate line G2, a fourth source electrode 622 connected to the first data line D1 and a fourth drain electrode 623 connected to the fourth pixel electrode 61. The fourth pixel electrode 61 is set closer to the adjacent first data line D1 that is connected with it than the third pixel electrode 51, and the third thin film transistor 52 and the fourth thin film transistor 62 are both set close to the first data line D1 connected with them. A third connecting trace 70 is set between the third drain electrode 523 and the third pixel electrode 51, a fourth connecting traces 80 that corresponds to the connecting trace 70 and matches the capacitance of the third pixel unit 50 with the capacitance of the fourth pixel unit 60 is set between the fourth drain electrode 623 and the fourth pixel electrode 61. Namely in the present embodiment, the first pixel unit 10, the second pixel unit 20, the third pixel unit 50, and the fourth pixel unit 60 are included between the first gate line G1 and the second gate line G2. The first pixel unit 10 and second pixel unit 20 are connected to a same first data line D1, the first pixel electrode 11 of the first pixel unit 10 connected to the first gate line G1 is set closer to the first data line D1 connected with the first pixel electrode 11; and for the third pixel unit 50 and the fourth pixel unit 60 that are connected to another first data line D1, the fourth pixel electrode 61 of the fourth pixel unit 60 connected to the second gate line G2 is set closer to the another first data line D1. Such arrangement improves the flexibility of the arrangement of the pixel units.

In the present embodiment, similar to the arrangements of the first pixel unit 10 and the second pixel unit 20, the third pixel electrode 51 of the third pixel unit 50, and the fourth pixel electrode 61 of the fourth pixel unit 60 are in different distances with the first data line D1 that is connected with them, and the third thin film transistor 52 and the fourth thin transistor 62 are both set close to the first data line D1 that is connected with them, namely the third thin film transistor 52 and the fourth thin film transistor 62 are set on one side of the first data line D1. Thus, a distance between the third thin film transistor 52 and the third pixel electrode 51 is not equal to a distance between the fourth thin film transistor 62 and the fourth pixel electrode 61. The third thin film transistor 52 and the fourth thin film transistor 62 are set at one side of the first data line D1, which effectively avoids a problem of area occupation of the pixel electrode arrangement, so that the third pixel electrode 51 and the fourth pixel electrode 61 can be ensured to have good symmetry, and the area of the non-display area is reduced, thereby improving the pixel opening ratio. Furthermore, the third connecting trace 70 that connects the third drain electrode 523 and the third pixel electrode 51 is set correspondingly to the fourth connecting trace 80 that connects the fourth drain electrode 623 and the fourth pixel electrode 61 so that the capacitance of the third pixel unit 50 matches with the capacitance of the fourth pixel unit cells 60, namely, through the matching arrangement of the third connecting trace 70 and the fourth connecting trace 80, the capacitance matching of the third pixel unit 50 and the fourth pixel unit 60 is ensured, and the uniformity of the display brightness is improved, facilitating the display quality. Further, through realizing the capacitance matching of the third connecting trace 70 and the fourth connecting trace 80 which are both drain electrode connecting traces, the difficulty of the line management is reduced and the difficulty of the production is reduced.

In the present embodiment, line impedances of the third connecting trace 70 and the fourth connecting trace 80 are equivalent, thus it is beneficial to ensure that the capacitance of the third pixel electrode 51 matches with the capacitance of the fourth pixel electrode 61, which improves the display quality. More specifically, the lengths of the third connecting trace 70 and the fourth connecting trace 80 are set to be the same and widths of the third connecting trace 70 and the fourth connecting trace 80 are set to be the same, which is convenient for ensuring the line impedances to be equivalent. In the present embodiment, a storage capacitance of the third connecting trace 70 equals to a storage capacitance of the fourth connecting trace 80. In the present embodiment, similar to an arrangement corresponding to the first pixel unit 10, the first gate line G1 and the second gate line G2 in positions corresponding to the fourth pixel unit 60 respectively form a containing space of the third thin film transistor 52 and a containing space of the fourth thin film transistor 62 through bending line arrangements, thereby reducing the non-display area, and it is beneficial for improving the pixel opening ratio. Two ends of the first gate line G1 connected to the third gate electrode 521 are staggered and arranged in a first direction. Two ends of the second gate line G2 connected to the fourth gate electrode 621 are staggered and arranged in the first direction. The third source electrode 522 and the third drain electrode 523 are arranged extending along the second direction. A fourth source electrode 622 and a fourth drain electrode 623 are both arranged extending along the second direction, so that the third thin film transistor 52 and the fourth thin film transistor 62 in the first direction may be set to be relatively narrow, thereby ensuring the condition of being arranged on one side of the fourth pixel electrode 61 and not occupying the pixel electrode arrangement area, an area of the non-display region is effectively reduced, and it is beneficial for increasing the pixel opening ratio.

Figure 7:
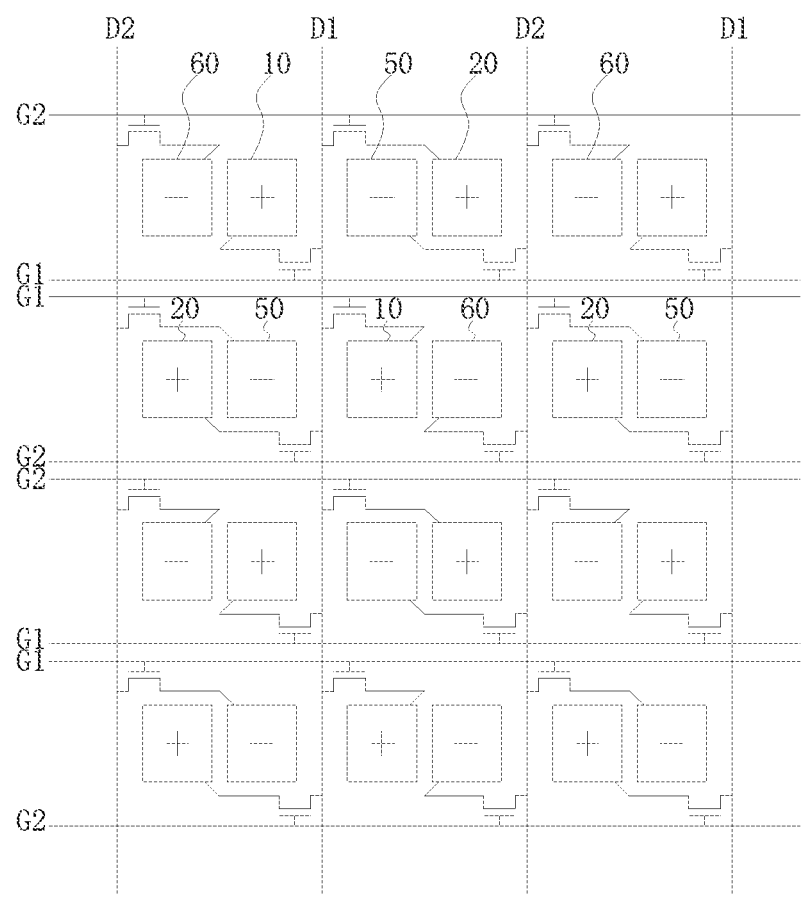
FIG. 7 is a schematic diagram of pixel arrangement of still another embodiment of the pixel structure of the present disclosure.
Figure 8:
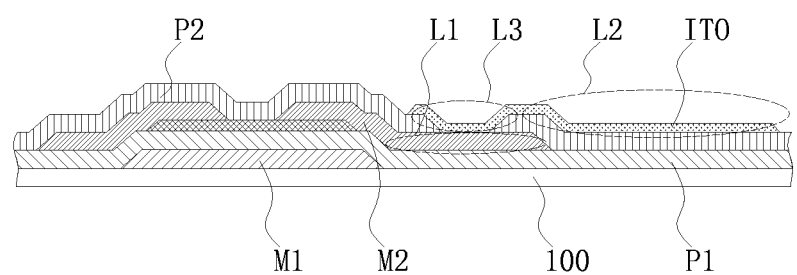
FIG. 8 is a schematic structural diagram of an embodiment of an array substrate of the present disclosure.

In one embodiment, referring to FIG. 7, the first pixel unit 10 and the second pixel unit 20 are respectively located on two sides of the first data D1 that are connected to them. Further, the third pixel unit 50 is set between the second pixel unit 20 and the first data line D1, a third pixel unit 50 is connected to the second data line D2 adjacent to the first data line D1 and extended in the first direction, and one side of the second data line D2 away from the third pixel unit 50 is connected to the fourth pixel unit 60; the third pixel unit 50 is connected to the first gate line G1, the fourth pixel unit 60 is connected to the second gate line G2. In this embodiment, the first pixel unit 10 and the second pixel unit 20 are respectively arranged on two sides of the first data line D1, and the first pixel unit 10 and the second pixel unit 20 are separated through the third pixel unit 50. Namely, the first pixel unit 10 and the third pixel unit 50 are respectively arranged on the two sides of the first data line D1. The second pixel unit 20 is set on a side of the third pixel unit 50 far away from the first data line D1, the first pixel unit 10 and the second pixel unit 20 are connected to the first data line D1, and the third pixel unit 50 is connected with a second data line D2 adjacent to the first data lines. The arrangement enables each pixel unit to be opposite to its adjacent pixel units in polarity, thus improving the display quality of the display panel. The distances that first pixel unit 10 and the second pixel unit 20 connected to the same first data line D1 to the first data line D1 are not equivalent. Configuring both of the first thin film transistor 12 and the second thin film transistor 22 on a side of the first data line D1 may effectively ensure a good symmetry of the first pixel electrode 11 and the second pixel electrode 21, and the area of the non-display area is reduced, thereby optimizing the pixel opening ratio. Moreover, through the matching arrangement of the first connecting trace 30 and the second connecting trace 40, the capacitance matching of the first pixel unit 10 and the second pixel unit 20 is ensured, thereby improving the brightness uniformity of the display panel which is beneficial for improving the display quality, and through the first connecting trace 30 and the second connecting trace 40 which are both drain electrode connecting traces, a capacitance matching is matched, thereby reducing the difficulty of the line arrangement and reducing the difficulty of the production process.

In the present embodiment, similar to the arrangements of the first pixel unit 10 and the second pixel unit 20, the third pixel unit and the fourth pixel unit 60 are connected with the same second data line D2. Specifically, as shown in FIG. 7 as an example, in the second direction namely the gate line direction, the third pixel unit 50 is set between the first pixel unit 10 and the second pixel unit 20, and the second pixel unit 20 is set between the third pixel unit 50 and the fourth pixel unit 60. The first data line D1 is set between the third pixel unit 50 and the first pixel unit 10; the second data line D2 is set between the fourth pixel unit 60 and the second pixel unit 20. Namely, the distances between the third pixel unit 50 and the fourth pixel unit 60 which are both connected to the second data line D2 are different. Likewise, similar to the arrangements of the first pixel unit 10 and the second pixel unit 20, in this embodiment, the third pixel unit 50 and the thin film transistor of the fourth pixel unit 60 are both set on one side of the second data line D2, which can effectively ensure the symmetry of the pixel electrodes of the third pixel unit 50 and the fourth pixel unit 60 and reduce the area of the non-display area, thereby improving the opening ratio of the pixel. Moreover, through a matching arrangement of the drain electrode connecting traces of the third pixel unit 50 and the fourth pixel unit 60, it ensures that the capacitance matching of the third pixel unit 50 and the fourth pixel unit 60, thereby improving the brightness uniformity of the display panel and the display quality, and reducing the difficulty of the line arrangement and the difficulty of the production process.

An embodiment of the present disclosure further provides an array substrate, please refer to FIG. 1 to FIG. 8, the array substrate includes a base substrate GS and any pixel structure as described above.

A detailed structure of the pixel structure, reference may be made to the detailed structure of the above embodiments and will not be repeated here. It is to be understood that because the pixel structure described above are used in the array substrate of the present disclosure, thus the embodiments of the array substrate includes all embodiments of the technical scheme of the pixel structure, and can achieve the technical effects of the above technical scheme which are not described in details here.

Specifically, the base substrate GS is formed with:

a first metal layer M1, where the first metal layer M1 forms the first gate line G1, the second gate line G2, the first gate electrode 121 and the second gate electrode 221;

a first insulating layer P1 set on the first metal layer M1;

a second metal layer M2 set on the first insulating layer P1, where the second metal layer M2 forms the first data line D1, the first source electrode 122, the first drain electrode 123, the second source electrode 222 and the second drain electrode 223;

a second insulating layer P2 set on the second metal layer M2;

an transparently conductive layer ITO forming the first pixel electrode 11 and the second pixel electrode 21;

The first connecting trace 30 and the second connecting trace 40 both include a metal line section L1 formed by the second metal layer M2, an transparent line section L2 formed by the transparently conductive layer ITO and a via connecting section L3 set between the transparent line L2 and the metal line L1 and crossing through the second insulating layer P2, In this embodiment, the first thin film transistor 12 and the second thin film transistor 22 both include two metal layers, two insulating layers, an active layer and an ohmic contact layer. The material of the two metal layers may be the same or different, for example, aluminum or copper may be used to form the two metal layers. The first gate line G1, the second gate line G2, the first gate electrode 121 and the second gate electrode 221 may be made of a same metal layer, which may be specifically obtained by the first metal layer M1, which is patterned to form the first gate line G1, the second gate line G2, the first gate electrode 121 and the second electrode 221. The first data line D1, the first source electrode 122, the first drain electrode 123, the second source electrode 222 and the second drain electrode 223 may be made of a same metal layer, and particularly it may adopt the second metal layer M2 to be patterned to form the first data line D1, the first source electrode 122, the first drain electrode 123, the second source electrode 222 and the second drain electrode 223. Further, the second metal layer M2 may also form a metal line section connecting with the first drain electrode 123 and the first pixel electrodes 11, and a metal line section connecting with the second drain electrode 223 and the second pixel electrode 21. In this embodiment, the first insulating layer P1 is a gate insulating layer, the second insulating layer P2 is a passivation layer. The transparent conductive layer ITO may form the first pixel electrode 11 and the second pixel electrode 21, and the transparent conductive layer ITO can be an ITO thin film layer.

In this embodiment, the first connecting trace 30 and the second connecting trace 40 both include a metal line section L1 formed by the second metal layer M2, a transparent line section L2 formed by the transparently conductive layer ITO and a via connecting section L3 going through the second insulating layer P2 and connected between the transparent line section L2 and the metal line section L1. Namely, a conductive connection crossing different layers of the first drain electrode 123 and the first pixel electrode 11 can be realized by a via. However, the matching arrangement of the first connecting trace 30 and the second connecting trace 40 can be realized by the matching arrangement of the metal line section L1, can be also realized by the matching arrangement of the transparent line section L2. For example, referring to the FIG. 4, a main portion of each of the first connecting trace 30 and the second connecting trace 40 is the metal line section L1 formed by the second metal layer M2. A via formed in the first connecting trace 30 and a via formed in the first connecting trace 40 are set in a symmetric manner, and are both set close to the first pixel electrode 11 and the second pixel electrode 21. For example, referring to FIG. 1, the via formed in the first connecting trace 30 is set close to the first thin film transistor 12, namely it reduces the length of the metal line section L1 of the first connecting trace formed by the second metal layer M2. Similarly, the via L3 formed in the second connecting trace 40 is set close to the second thin film transistor 42, namely it reduces the length of the metal line section L1 of the first connecting trace 40 formed by the second metal layer M2, thereby reducing the generation of parasitic capacitance.

In one embodiment, the first metal layer M1 also forms the third gate electrode 521 and the fourth gate electrode 621, the second metal layer M2 also form the third source electrode 522, the third drain electrode 523, the fourth source electrode 622 and the fourth drain electrode 623, and the transparently conductive layer ITO also forms the fourth pixel electrode 51 and the fourth pixel electrode 61. The third connecting trace 70 and the fourth connecting trace 80 each include the metal line section L1 formed by the second metal layer M2, the transparent line section L2 formed by the transparently conductive layer ITO and the via connecting section L3 going through the second insulating layer P2 and set between the transparent line section L2 and the metal line section L1. Namely, the layer structures of the first pixel unit 10, the second pixel unit 20, the third pixel unit 50 and the fourth pixel unit 60 are the same, which can be formed by a same production process. The matching arrangement between the third connecting trace 70 and the fourth connecting trace 80 can be realized though a matching arrangement of the metal line section L1, can also be realized through the matching arrangement of the transparent line section L2.

Figure 9:
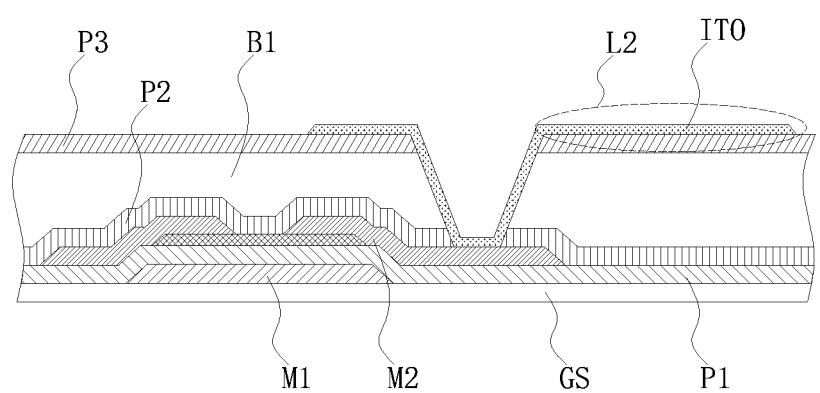
FIG. 9 is a schematic structural diagram of another embodiment of the array substrate of the present disclosure.

In one embodiment, referring to FIG. 9, the array substrate further includes a color resistance layer B1 set on the second insulating layer P2. The transparent line section ITO is set on the color resistance layer B1, and the via connecting section L3 is set to be crossing through the color resistance layer B1. In this embodiment, the pixel structure can be realized by adopting a COA (CF on Array) process, namely integrating a color filtering piece and the array substrate, specifically spreading color resistances on the array substrate to form the color resistance layer B1. The transparently conductive layer ITO is set on the color resistance layer B1. The color resistance layer B1 is set between the second metal layer M2 on the first insulating layer P1 and the transparent layer ITO for insulation usage. In this embodiment, the second insulating layer P2 is set between the second metal layer M2 and the transparent conductive layer ITO for insulation usage. The line arrangement of the first connecting trace 30 is set through the transparent line section L2 on the color resistance layer B1 formed by the transparently conductive layer ITO. Similarly, the line arrangement of the second connecting trace 40 is set through the transparent line section L2 on the color resistance layer B1 formed by the transparently conductive layer ITO. In the present embodiment, the capacitance of the first pixel unit 10 and the capacitance of the second pixel unit 20 matches by the matching arrangement of the transparent line sections L2 of the first connecting trace 30 and the second connecting trace 40. The arrangement above on one hand reduces the difficulty of the line arrangements of the first connecting trace 30 and the second connecting trace 40, reduces the difficulty of the production process, and is beneficial for the matching arrangement of the first connecting trace 30 and the second connecting trace 40, which realizes the capacitance matching of the first pixel unit 10 and the second pixel unit 20. On the other hand, it also reduces the generation of parasitic capacitance; furthermore, by utilizing the COF production process for forming the color resistance layer B1 to arrange the lines, which does not increase the production procedures, and is beneficial to ensure the production efficiency. In one embodiment, the third insulating layer P3 is arranged between the color resistance layer and the transparent conductive layer ITO, in particular the third insulating layer P3 may be an organic material or be an inorganic material, the third insulating layer P3 may be adopting the same material with the first insulating layer P1 and the second insulating layer P2.

The present disclosure also provides a display panel including the pixel structure. The detailed structure of the pixel structure can be made reference to the embodiments described above, and is not repeatedly described here. It should be understood that because the pixel structure described above is used in the display panel, the embodiments of the display panel includes all of the technical schemes of the pixel structure described above, and can achieve the technical effect of those technical schemes.

The disclosure further provides a display panel, including the above array substrate and a color film substrate set opposite to the array substrate. In particular, liquid crystal molecules are set between the color film substrate and the array substrate. The color film substrate, the array substrate and the liquid crystal can be packed and installed to form a display panel through frame glue. The embodiments of the display panel includes all technical schemes of the embodiments of the pixel structure described above, and can achieve the technical effects of those technical schemes.

Above are only some embodiments of the present disclosure, and are not intended to limit the scope of the present disclosure. As long as being in the concept of the disclosure, any equivalent structure being made by utilizing the specification and drawings of the present disclosure, or any directly/indirectly application in other related technical fields are included in the patent scope of the disclosure.

The invention claimed is:
1. A pixel structure comprising:
a first data line extending in a first direction;
a first gate line and a second gate line both extending in a second direction across the first direction;
a first pixel unit comprising:
    a first pixel electrode; and
    a first thin film transistor comprising:
        a first gate electrode connected to the first gate line;
        a first source electrode connected to the first data line; and
        a first drain electrode connected to the first pixel electrode;
a second pixel unit comprising:
    a second pixel electrode; and
    a second thin film transistor comprising:
        a second gate electrode connected to the second gate line;
        a second source electrode connected to the first data line; and
        a second drain electrode connected to the second pixel electrode;
wherein, the first pixel unit and the second pixel unit are aligned in the second direction; the first pixel electrode is set closer to the first data line than the second pixel electrode, the first thin film transistor and the second thin film transistor are both set close to the first data line;
a first connecting trace is set between the first drain electrode and the first pixel electrode, a second connecting trace is set between the second drain electrode and the second pixel electrode to make a capacitance of the first pixel unit matching with a capacitance of the second pixel unit;
a length of the first connecting trace and the second connecting trace is equivalent, and a width of the first connecting trace and the second connecting trace is equivalent; or
the length of the first connecting trace and the second connecting trace is different, and the width of the first connecting trace and the second connecting trace is different.

2. The pixel structure of claim 1, wherein the first pixel unit and the second pixel unit are set on a same side of the first data line.

3. The pixel structure of claim 2, wherein the first thin film transistor and the second thin film transistor are respectively set on two sides of the first direction that the first pixel electrode is along and are symmetrically arranged.

4. The pixel structure of claim 1, wherein shapes of the first pixel electrode and the second pixel electrode are the same and the first pixel electrode and the second pixel electrode are set symmetrically.

5. The pixel structure of claim 1, wherein the first gate line comprises:
a first containing section set away from the first pixel electrode in the first direction;
a first connecting section close to the second pixel electrode in the first direction; and
a first bending section set between the first containing section and the first connecting section;
wherein, a containing space to contain the first thin film transistor is formed between the first containing section and the first bending section;
the second gate line comprises:
a second containing section set away from the first pixel electrode in the first direction;
a second connecting section set in the first direction close to the second pixel electrode in the first direction; and
a second bending section set between the second containing section and the second connecting section;
wherein, a containing space of the second thin film transistor is formed between the second containing section and the second bending section.

6. The pixel structure of claim 1, wherein two terminals of the first gate line connected to the first gate electrode are set in a staggered manner in the first direction; and two terminals of the second gate line connected to the second gate electrode are set in a staggered manner in the first direction.

7. The pixel structure of claim 1, wherein the first source electrode and the first drain electrode are both extendedly arranged along the second direction; and the second source electrode and the second drain electrode are both extendedly arranged the second direction.

8. The pixel structure of claim 1, wherein line impedances of the first connecting trace and the second connecting trace are equivalent.

9. The pixel structure of claim 1, wherein a storage capacitance formed by the first connecting trace is equal to a storage capacitance formed by the second connecting trace.

10. The pixel structure of claim 9, wherein the pixel structure further comprises a common electrode; the storage capacitance of the first pixel unit is formed by the common electrode and the first pixel electrode as well as the common electrode and the first connecting trace; the storage capacitance of the second pixel unit is formed by the common electrode and the second pixel electrode as well as the common electrode and the second connecting trace.

11. The pixel structure of claim 1, wherein the pixel structure comprises a plurality of first data lines, and the plurality of first data lines are arranged in the second direction; the pixel structure comprises a plurality of first gate lines and a plurality of second gate lines, the plurality of first gate lines and the plurality of second gate lines are arranged along the first direction; the pixel structure comprises a plurality of first pixel units and a plurality of second pixel units, the plurality of first pixel units and the plurality of second pixel units are arranged in an array; wherein, a pixel group is formed by one first pixel unit and one second pixel unit which are adjacent with each others in the second direction and are connecting to a same first data line, two pixel groups adjacent in the first direction, are respectively connected to two adjacent first data lines.

12. The pixel structure of claim 11, wherein projections of the two adjacent pixel groups in the first direction are arranged embeddedly.

13. The pixel structure of claim 1, wherein the pixel structure comprises:

at least two first data lines;
a third pixel unit connected to the first gate line; and
a fourth pixel unit connected to the second gate line;
wherein, the third pixel unit and the first pixel unit are respectively connected to two of the at least two first data lines, the third pixel unit and the fourth pixel unit are connected to a same one of the at least two first data lines;
the third pixel unit comprises:
a third pixel electrode; and
a third thin film transistor, comprising:
a third gate electrode connected to the first gate line,
a third source electrode connected to one of the at least two first data lines; and
a third drain electrode connected to the third pixel electrode;
the fourth pixel unit comprises:
a fourth pixel electrode; and
a fourth thin film transistor, comprising:
a fourth gate electrode connected to the second gate line;
a fourth source electrode connected to the one of the at least two first data lines, and
a fourth drain electrode connected to the fourth pixel electrode;
wherein, the fourth pixel electrode is set closer to the one of the at least two first data lines than the third pixel electrode, the third thin film transistor and the fourth thin film transistor are both set closed to the one of the at least two first data lines;
a third connecting trace is set between the third drain electrode and the third pixel electrode, a fourth connecting trace is set between the fourth drain electrode and the fourth pixel electrode to correspond to the third connecting trace and match a capacitoance of the third pixel unit with a capacitance of the fourth pixel unit.

14. The pixel structure of claim 1, wherein the first pixel unit and the second pixel unit are respectively located at two sides of the first data line.

15. The pixel structure of claim 14, wherein a third pixel unit is set between the second pixel unit and the first data line, the third pixel unit is connected to a second data line that is extended along the first direction and is adjacent to the first data line; a side of the second data line that is far from the third pixel line is connected to the fourth pixel unit; the third pixel unit is connected to the first gate line, the fourth pixel unit is connected to the second gate line.

16. An array substrate comprising a base substrate and a pixel structure of claim 1; the base substrate is formed with:
a first metal layer forming the first gate line, the second gate line, the first gate electrode and the second gate electrode;
a first insulating layer set on the first metal layer;
a second metal layer set on the first insulating layer and forming the first data line, the first source electrode, the first drain electrode, the second source electrode and the second drain electrode;
a second insulting layer set on the second metal layer;
a transparently conductive layer forming the first pixel electrode and the second pixel electrode;
wherein the first connecting trace and the second connecting trace each comprises a metal line section formed by the second metal layer, a transparent line section formed by the transparently conductive layer and a via connecting section set between the transparent line and the metal line and crossing through the second insulating layer.

17. The array substrate of claim 16, further comprising a color resistance layer set on the second insulating layer, wherein the transparent line section is set on the color resistance layer; the via connecting section is set to be crossing through the color resistance layer.

18. The array substrate of claim 16, wherein the first connecting trace and the second connecting trace is set to match the capacitance of the first pixel unit with the capacitance of the second pixel unit through a matching setting of transparent line sections.

19. A display panel comprising a pixel structure of claim 1.

20. A display panel comprising an array substrate of claim 16 and a color film substrate set oppositely to the array substrate.

* * * * *